(12) United States Patent
Mayenburg et al.

(10) Patent No.: US 9,203,782 B2
(45) Date of Patent: *Dec. 1, 2015

(54) HIGH DENSITY NETWORKING SHELF AND SYSTEM

(71) Applicants: Anthony J. Mayenburg, Carp (CA); Simon J. E. Shearman, Ottawa (CA); Michael Bishop, Ottawa (CA); Michael Tabatchnik, Ottawa (CA); Lloyd Cosman, Stittsville (CA)

(72) Inventors: Anthony J. Mayenburg, Carp (CA); Simon J. E. Shearman, Ottawa (CA); Michael Bishop, Ottawa (CA); Michael Tabatchnik, Ottawa (CA); Lloyd Cosman, Stittsville (CA)

(73) Assignee: Ciena Corporation, Hanover, MD (US)

( * ) Notice: Subject to any disclaimer, the term of this patent is extended or adjusted under 35 U.S.C. 154(b) by 190 days.

This patent is subject to a terminal disclaimer.

(21) Appl. No.: 14/085,343

(22) Filed: Nov. 20, 2013

(65) Prior Publication Data

US 2015/0139223 A1 May 21, 2015

(51) Int. Cl.
| | |
|---|---|
| *H05K 7/14* | (2006.01) |
| *H04L 12/931* | (2013.01) |
| *H04L 12/933* | (2013.01) |
| *H05K 5/02* | (2006.01) |
| *H05K 7/20* | (2006.01) |

(52) U.S. Cl.
CPC ............... *H04L 49/40* (2013.01); *H04L 49/10* (2013.01); *H05K 5/0213* (2013.01); *H05K 7/20145* (2013.01); *H05K 7/20172* (2013.01); *H05K 7/1424* (2013.01)

(58) Field of Classification Search
CPC . H05K 5/0213; H05K 7/1424; H05K 7/1425; H05K 7/1487; H05K 7/1488; H05K 7/20145; H05K 7/20172; H05K 7/202

USPC ............... 361/679.46–679.54, 688–723, 361/724–727; 174/15.1–15.2, 16.1–16.3; 312/223.1–223.3, 236; 454/184–186
See application file for complete search history.

(56) References Cited

U.S. PATENT DOCUMENTS

| | | |
|---|---|---|
| 3,874,444 A | 4/1975 | Perce et al. |
| 4,837,663 A | 6/1989 | Zushi et al. |
| 5,136,464 A | 8/1992 | Ohmori |
| 5,995,368 A | 11/1999 | Lee et al. |
| 6,698,079 B1 | 3/2004 | Mimlitch, III et al. |
| 6,972,949 B1 * | 12/2005 | Helgenberg et al. ..... 361/679.02 |
| 7,126,820 B2 | 10/2006 | Wei |
| 7,184,267 B2 | 2/2007 | Patel |

(Continued)

FOREIGN PATENT DOCUMENTS

WO     2010022597 A1     3/2010

*Primary Examiner* — Adrian S Wilson
*Assistant Examiner* — Abhishek Rathod
(74) *Attorney, Agent, or Firm* — Clements Bernard PLLC; Christopher L. Bernard; Lawrence A. Baratta, Jr.

(57) ABSTRACT

A system, a shelf, and a high density platform optimize physical arrangement of cards to maximize cooling effectiveness and line card pitch while minimizing backplane trace lengths between line interface and switch fabric cards. The shelf and system and associated card arrangement supports scaling to a larger, double size system that maintains the required length of backplane traces for card communications without compromising card cooling. Advantageously, the shelf and system maintains full NEBS compliance through an arrangement supporting full air intake/outtake through a front and/or back of the shelf or system, i.e. no side ventilation, and includes a false front to ensure all cards (switch fabric and line interface cards) are substantially flush with one another.

13 Claims, 9 Drawing Sheets

(56) References Cited

U.S. PATENT DOCUMENTS

| | | |
|---|---|---|
| 7,259,961 B2 | 8/2007 | Lucero et al. |
| 7,420,806 B1 | 9/2008 | Lima et al. |
| 7,447,020 B2 | 11/2008 | Xia et al. |
| 7,633,754 B1 | 12/2009 | Mumper |
| 7,701,710 B2 | 4/2010 | Tanaka et al. |
| 7,864,519 B2 | 1/2011 | Lin et al. |
| 7,933,120 B2 | 4/2011 | Tanaka et al. |
| 7,957,133 B2 | 6/2011 | Zieman et al. |
| 8,154,867 B2 | 4/2012 | Shearman et al. |
| 8,755,192 B1 * | 6/2014 | Schrempp et al. ............. 361/736 |
| 2004/0032722 A1 * | 2/2004 | Wrycraft et al. ............... 361/725 |
| 2005/0073809 A1 * | 4/2005 | Chang ........................... 361/684 |
| 2005/0078449 A1 | 4/2005 | Makooi et al. |
| 2007/0258211 A1 | 11/2007 | Sonobe et al. |
| 2008/0192454 A1 | 8/2008 | Knutsson |
| 2011/0182030 A1 * | 7/2011 | Mayer ...................... 361/679.58 |
| 2013/0100610 A1 | 4/2013 | Schneider et al. |

\* cited by examiner

HIGH DENSITY NETWORKING SHELF AND SYSTEM

FIELD OF THE DISCLOSURE

The present disclosure relates generally to networking equipment. More particularly, the present disclosure relates to a high density (HD) networking shelf and system that may be used in telecommunication networks, data communication networks, and the like.

BACKGROUND OF THE DISCLOSURE

Networks are continuing to grow, with current and projected rates in excess of 30% annualized increase in bandwidth. Such growth rates imply network bandwidth doubling approximately every two-and-a-half years. At the same time, network hardware cost, space, and power consumption allocations are staying roughly flat. Equipment manufacturers must therefore deliver substantial continuous reductions in per-bit metrics related to cost, space, and power. Telecommunication, data communication, high-performance computing, and the like systems are typically deployed in physical hardware shelves that are mounted in racks or frames. For example, typical racks or frames are either 19, ~21, or 23 inches in practice. A rack unit (abbreviated as U or RU) is a unit of measure describing the height of equipment intended for mounting in a rack or frame, e.g. one RU equals 1.75 inches (44.45 mm) in height. Various standards associated with racks or frames are described by Telecordia's GR-63-CORE, "NEBS Requirements: Physical Protection" (04/2012), European Telecoms Standards Institute (ETSI), American National Standard Institute (ANSI), etc.

A conventional system includes a number of vertically arranged cards that are inserted into a backplane in a physical shelf mounted to a rack (e.g., 19", ETSI, or 21" rack). A conventional system may also include a combination of vertically arranged cards and horizontally arranged cards inserted into a backplane and/or midplane. Note, cards can also be interchangeably referred to as modules, blades, circuit packs, etc. Generally, in networking systems, cards can be further divided into functionality with cards either being line cards and/or switch cards. The line cards provide input/output (I/O) to the shelf and typically include a plurality of physical media devices such as optical transceivers, etc. on a front of the cards. The line cards can be referred to as I/O cards, interface cards, ingress/egress devices, and the like. The switch cards (which can also be referred to as fabrics or switch fabric cards) provide electrical and/or optical switching functionality and/or other processing functionality and typically do not include physical I/O ports on a front of the cards.

What is needed is a shelf and system that preserves compliance to various specifications (e.g., NEBS), conforms to service provider operational requirements, supports high density card deployment, and the like.

BRIEF SUMMARY OF THE DISCLOSURE

In an exemplary embodiment, a system includes one or more interface cards vertically insertable into a backplane; one or more switch fabric cards horizontally insertable into the backplane, wherein the one or more switch fabric cards comprise a false faceplate that is substantially flush with a faceplate of the one or more interface cards when each is inserted in the backplane; a first air path for air flow to cool the one or more interface cards; and a second air path for air flow to cool the one or more switch fabric cards, wherein each of the first air path and the second air path begin at a front portion of the system and end at a rear portion of the system. The system can further include a recess portion between the one or more interface cards and the one or more switch fabric cards, wherein the recess portion is formed by an extension on each of the one or more switch fabric cards. The first air path can extend from the recess portion to exhaust openings on a rear portion of the system. The system can further include interface fans located above the one or more interface cards, wherein the first air path extends from lower portions of the front portion of the system to exhaust openings on a rear portion of the system. The system can further include fabric fans located on a side of the one or more switch fabric cards, wherein the second air path extends from an opening on an opposite side from the fabric fans to exhaust openings on a lower rear portion of the system. The first air path and the second air path are separate. The false faceplate can include light pipes to display visual indicators from the one or more switch fabric cards. The one or more switch fabric cards are shorter in depth than the one or more interface cards and the false faceplate extends the one or more switch fabric cards to be substantially equal in depth to the one or more interface cards. The one or more interface cards can include a first set of interface cards located above the one or more switch fabric cards, and the system can further include one or more interface cards comprising a second set of interface cards located below the one or more switch fabric cards. The system can be mountable in a 19", ETSI, or 21" rack or frame.

In another exemplary embodiment, a shelf includes a housing; an interface cage in the housing for vertically insertable interface cards; a switch fabric cage in the housing for horizontally insertable switch fabric cards, wherein the switch fabric cage is shorter in depth than the interface cage thereby forming a recess portion therebetween, wherein the horizontally insertable switch fabric cards each include a false faceplate that is substantially flush with a faceplate of the vertically insertable interface cards when each is inserted in their associated cage; a first air path for air flow to cool the interface cage; and a second air path for air flow to cool the switch fabric cage, wherein each of the first air path and the second air path begin at a front portion of the housing and end at a rear portion of the housing. The first air path can extend from the recess portion to exhaust openings on a rear portion of the housing. The shelf can further include interface fans located above the interface cage, wherein the first air path extends from lower portions of the front portion of the housing to exhaust openings on a rear portion of the housing. The shelf can further include fabric fans located on a side of the switch fabric cage, wherein the second air path extends from an opening on an opposite side from the fabric fans to exhaust openings on a lower rear portion of the housing. The first air path and the second air path are separate. The false faceplate can include light pipes to display visual indicators from the one or more switch fabric cards. The horizontally insertable switch fabric cards are shorter in depth than the vertically insertable interface cards and the false faceplate extends the horizontally insertable switch fabric cards to be substantially equal in depth to the vertically insertable interface cards. The interface cage can include a first interface cage located above the switch fabric cage, and the shelf can further include a second interface cage located below the switch fabric cage. The shelf can be mountable in a 19", ETSI, or 21" rack or frame.

In yet another exemplary embodiment, a high density platform includes a housing mountable in a 19" rack; one or more interface cards vertically insertable into a backplane of the housing; one or more switch fabric cards horizontally insertable into the backplane, wherein the one or more switch fabric cards comprise a false faceplate that is substantially flush with a faceplate of the one or more interface cards when each is inserted in the backplane; wherein the one or more switch fabric cards are shorter in depth than the one or more interface cards and the false faceplate extends the one or more switch fabric cards to be substantially equal in depth to the one or more interface cards while concurrently forming an open recess portion between the one or more switch fabric cards and the one or more interface cards for air flow.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

In various exemplary embodiments, a high density (HD) networking shelf and system that may be used in telecommunication networks, data communication networks, and the like is described that optimizes physical arrangement of cards to maximize cooling effectiveness and line card pitch while minimizing backplane trace lengths between line and switch cards. The shelf and system and associated card arrangement supports scaling to a larger, double size system that maintains the required length of backplane traces for card communications without compromising card cooling. Advantageously, the shelf and system maintains full NEBS compliance through an arrangement supporting full air intake/outtake through a front and/or back of the shelf or system, i.e. no side ventilation, and includes a false front to ensure all cards (switch fabric and line interface cards) are substantially flush with one another.

Figure 1:
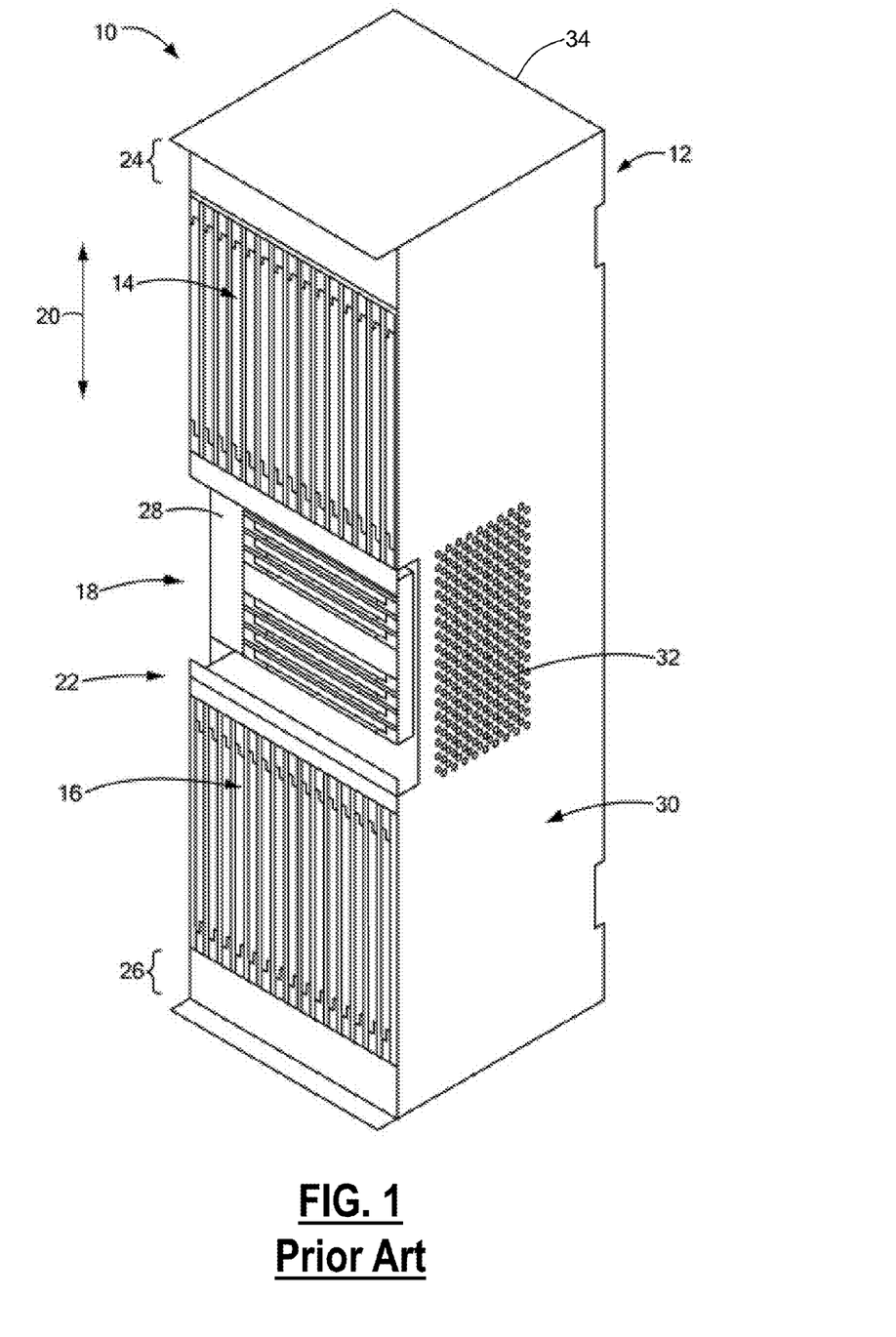
FIG. 1 is a perspective diagram of a high density platform.

Referring to FIG. 1, in an exemplary embodiment, a perspective diagram illustrates a high density platform 10. The high density platform 10 is described in detail in commonly-assigned U.S. Pat. No. 8,154,867, filed Apr. 2, 2010, issued Apr. 10, 2012, and entitled "HIGH DENSITY SWITCHING PLATFORM WITH INTERBAY CONNECTIONS ARRANGEMENT," the contents of which are incorporated herein. The high density platform 10 includes a housing 12 which can refer to any electronics rack, cabinet, case, frame, or other apparatus used to arrange and/or support a plurality of electronic components such as cards, including interface cards 14, 16 and switch fabric cards 18. The housing 12 may be metal, plastic, or combination, or other suitable material and similar in construction to other housings, cabinets and/or racks used to hold electronic components in place.

The housing 12 has a front side 22, a rear side 34 opposite the front side 22 and a third side 30 adjacent to both the front side 22 and the rear side 34. The housing 12 supports a first set of interface cards 14, a second set of interface cards 16, and a central set of switch fabric cards 18. The first set of interface cards 14 are arranged in a first direction 20. The second set of interface cards 16 are also arranged in the first direction 20. The central set of switch fabric cards 18 is arranged orthogonally, i.e., perpendicular, to the first direction 20. Each of the first set of interface cards 14, the second set of interface cards 16 and the central set of switch fabric cards 18 may optionally be surrounded by a separate metallic Faraday Cage including, for example a metal mesh screen. The orthogonal arrangement of the switch fabric cards 18 as compared with the interface cards 16, when combined with a system 10, allows faceplate interconnections from the first system to the next without preventing removability of the switch fabric cards or interface cards, due to cable dressing interference.

Each of the first set of interface cards 14, the second set of interface cards 16 and the central set of switch fabric cards 18 may also optionally be held in place by a frame or other support structure that may hold the sets of circuit cards 14, 16 and 18 firmly in place and facilitate removal and replacement of the circuit cards 14, such as for example a card cage or similar structure. The first set of interface cards 14, the second set of interface cards 16 and the central set of switch fabric cards 18 may all be removably inserted into the housing 12 through the front side 22 of the housing 12, thereby allowing circuit cards 14, 16 and 18 to be inserted and removed.

The housing 12 includes a first ventilation chamber 24 adjacent to the first set of interface cards 14, a second ventilation chamber 26 adjacent to the second set of interface cards 16 and a central ventilation chamber 28 adjacent to the central set of switch fabric cards 18. Each of the first ventilation chamber 24, the second ventilation chamber 26 and the central ventilation chamber 28 may be substantially sealed except at the airflow entry and exit points in order to facilitate directional airflow in each of the chambers. The third side 30 of the housing 12 has a side air access 32 located opposite to the central ventilation chamber 28 that is aligned with the central set of switch fabric cards 18. In this embodiment, the side air access 32 has openings there through forming a honeycomb pattern on the third side 30. Optionally, the side air access 32 may have a single, large opening, a series of elongate slits or other openings to facilitate the passing of ambient air through the side air access 32. The side air access 32 facilitates the flow of ambient air across the first set of interface cards 14, the second set of interface cards 16 and the central set of switch fabric cards 18.

Figure 2:
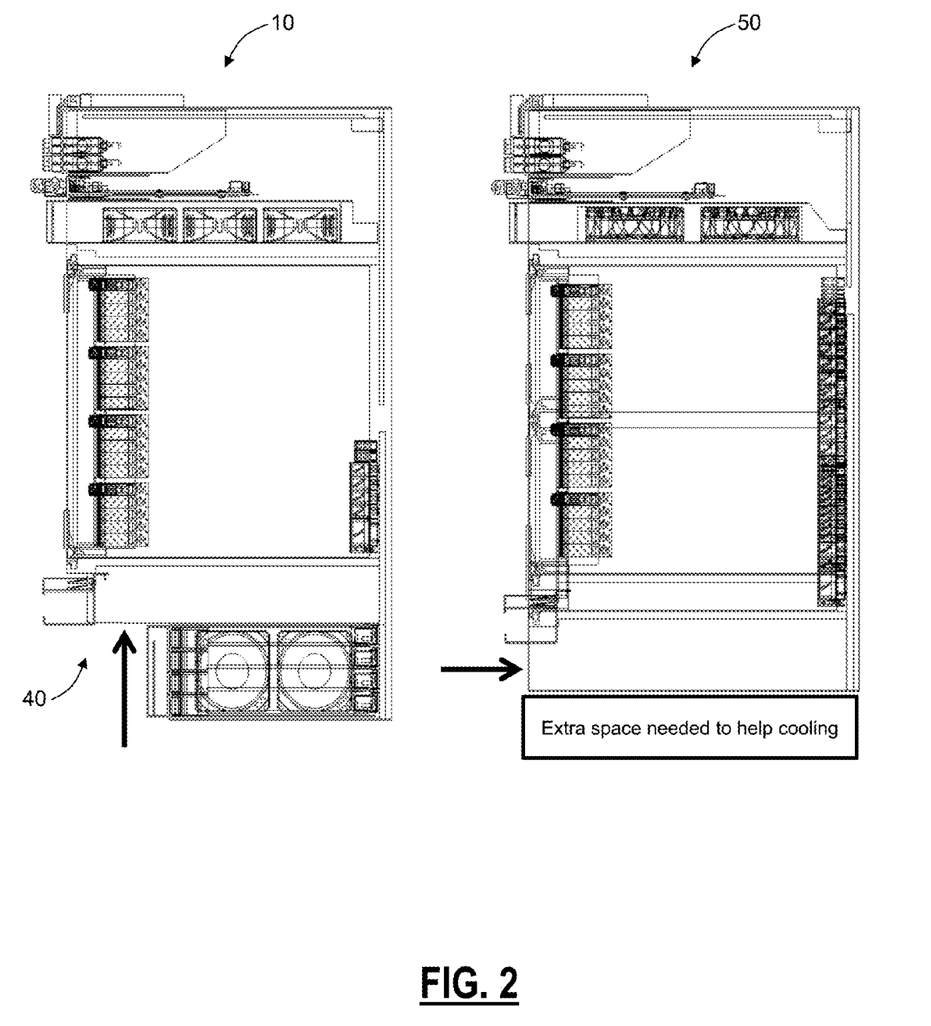
FIG. 2 is a perspective diagram of a platform with a recessed portion compared to a platform without the recessed portion to illustrate air flow.

Referring to FIG. 2, in an exemplary embodiment, a perspective diagram illustrates the platform 10 with a recessed portion 40 compared to a platform 50 without the recessed portion 40. The recessed portion 40 is formed due to the switch fabric cards 18 being shorted in depth than the interface cards 14 and positioned orthogonally therefrom. FIG. 2 illustrates the advantages of this card arrangement, i.e. horizontal fabric cards. The recessed portion 40 allows superior air flow into interface cards 14, while space is shared with fabric card section, and air easily goes through the front of the interface cards 14 to cool faceplate optics thereon. The platform 50 can include vertically aligned cards for the interface cards 14 and the switch fabric cards 18. Here, enough air inlet must be left below a fiber manager to allow sufficient air flow. This space is not shared, just open air, and air must turn back towards faceplates as it rushes inward toward the rear of the shelf. One disadvantage though of the recessed portion 40 is that the switch fabric cards 18 are recessed in the platform 10 relative to the interface cards 14. This can have operational disadvantages with faceplate indicators (e.g., LED lights) being offset or out of view as well as difficulties in inserting/removing the switch fabric cards 18.

Figure 3:
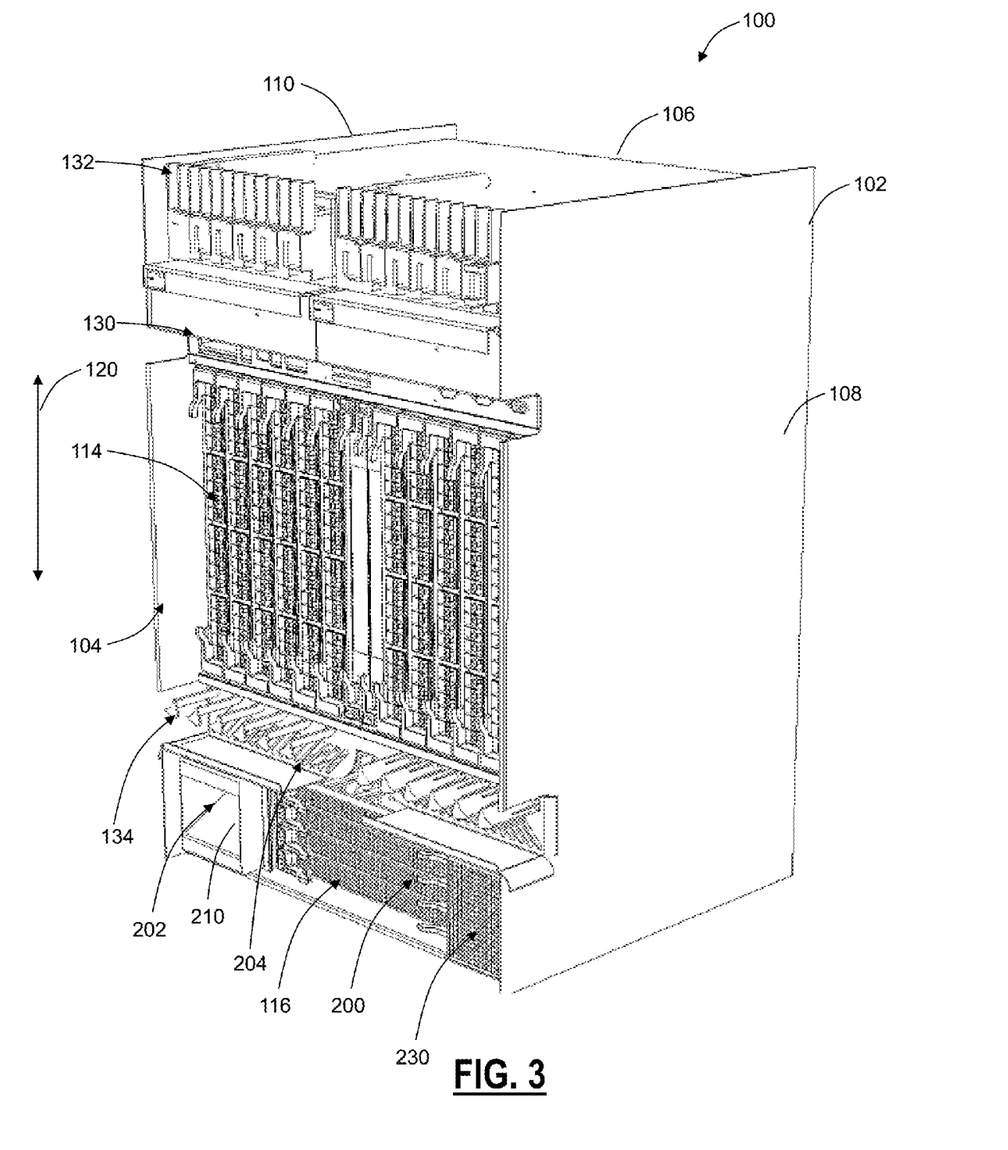
FIG. 3 is a front perspective diagram of a high density platform.
Figure 4:
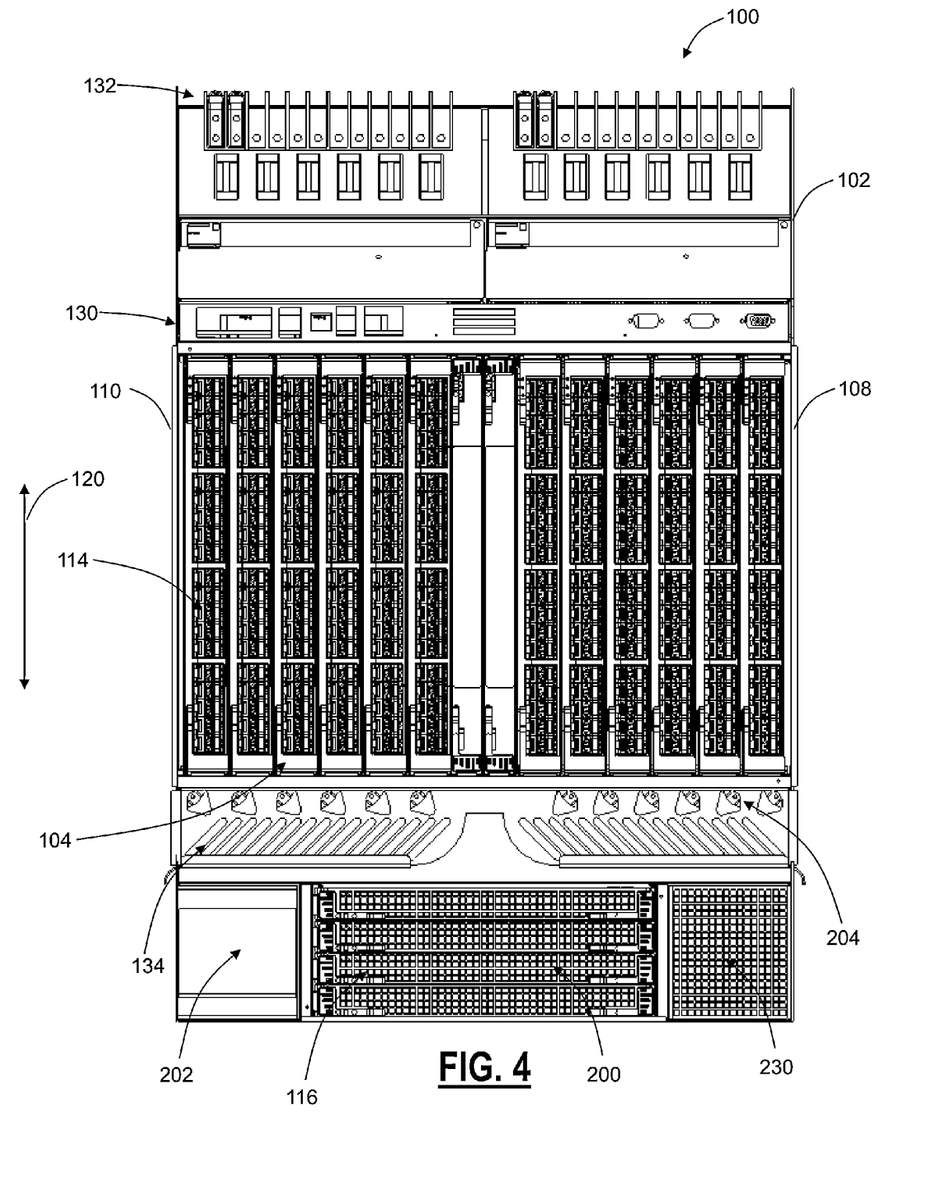
FIG. 4 is a front view of the high density platform of FIG. 3.
Figure 5:
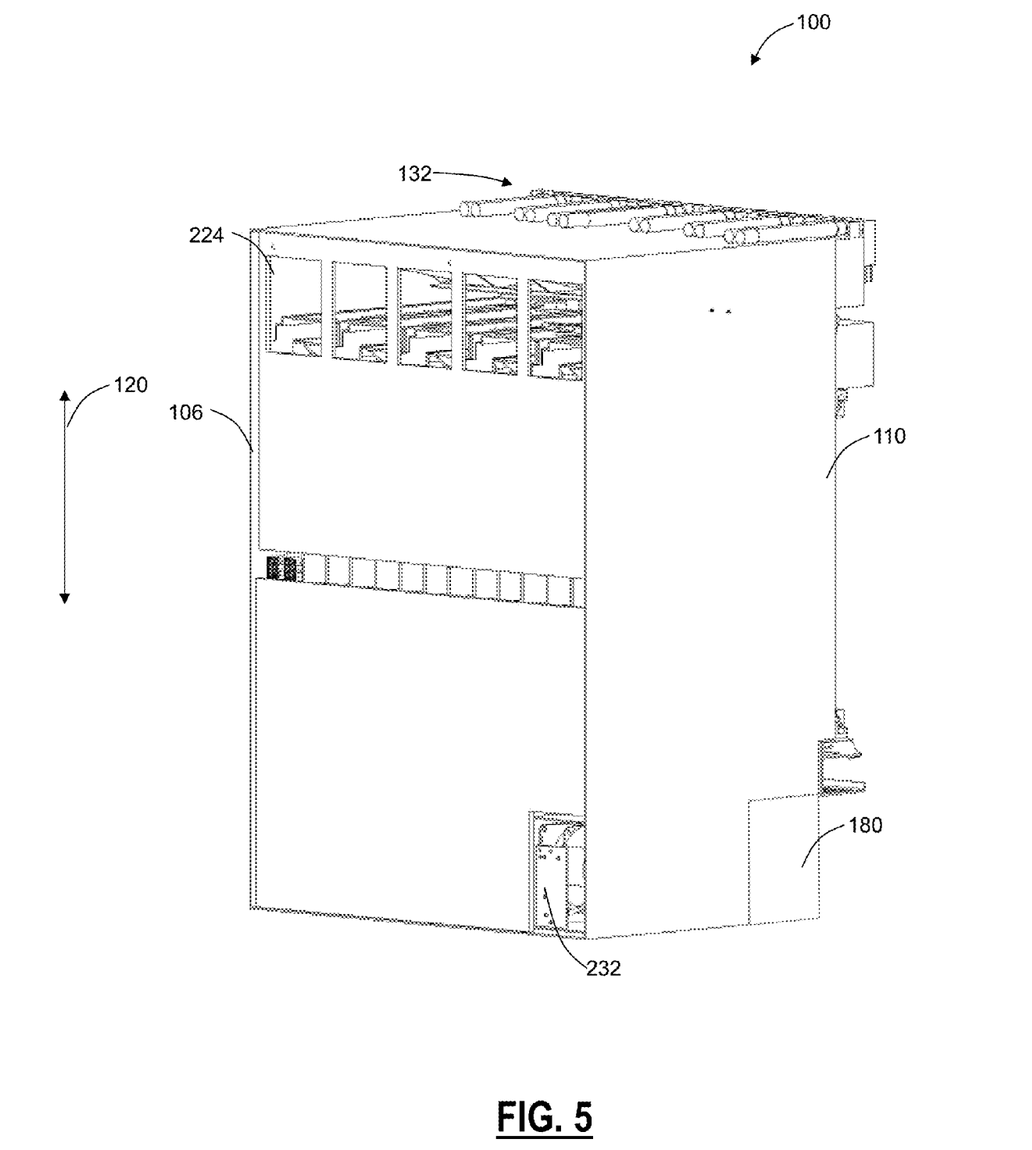
FIG. 5 is a rear perspective diagram of the high density platform of FIGS. 3-4.
Figure 6:
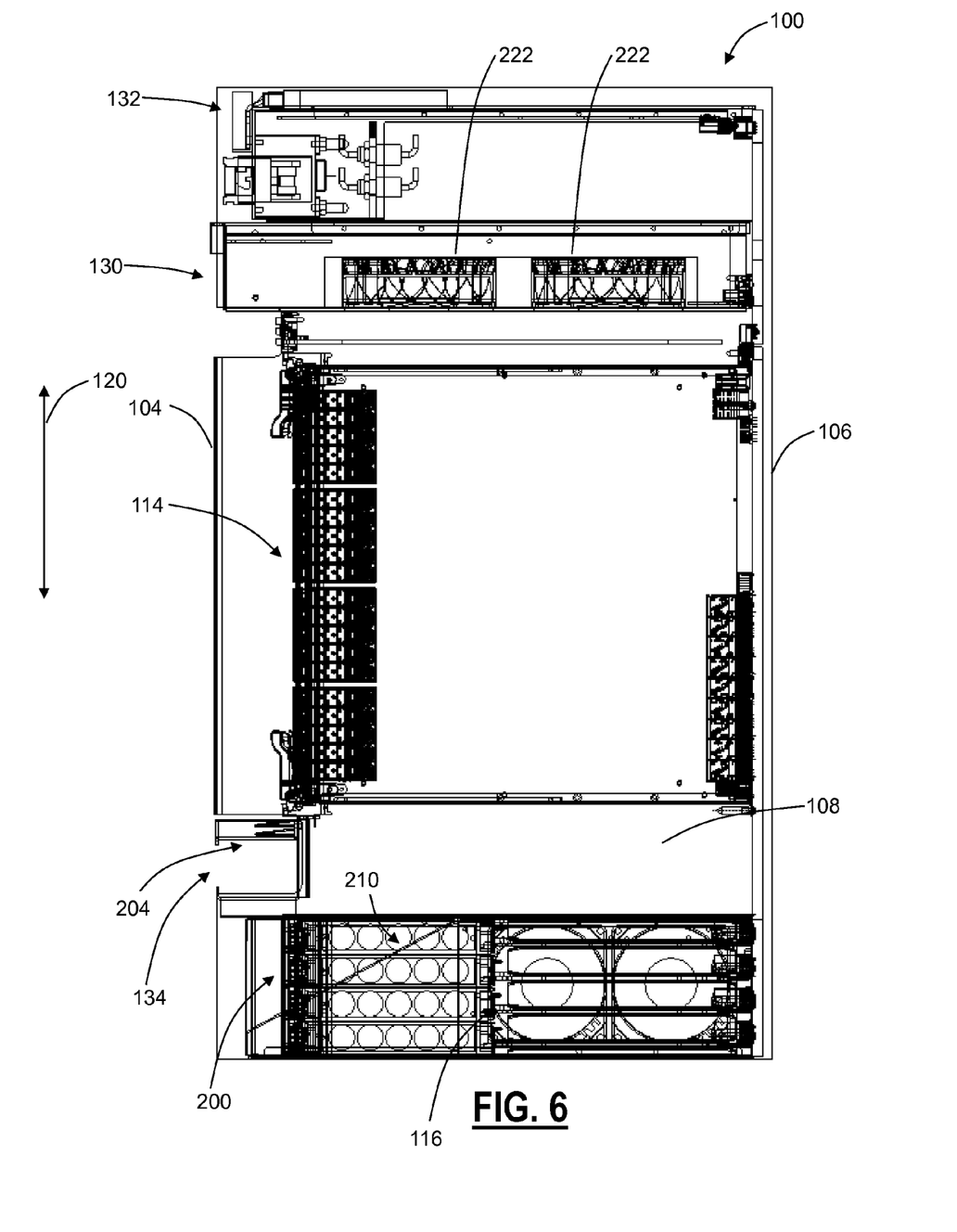
FIG. 6 is a cross-sectional internal diagram of the high density platform of FIGS. 3-5.

Referring to FIGS. 3-6, in an exemplary embodiment, various perspective diagrams illustrate a high density platform 100. The high density platform 100 can be a shelf, a system, etc. forming a network element, a node, etc. in a network. FIG. 3 is a front perspective diagram of the high density platform 100, FIG. 4 is a front view of the high density platform 100, FIG. 5 is a rear perspective diagram of the high density platform 100, and FIG. 6 is a cross-sectional internal diagram of the high density platform 100. Relative to the high density platform 10, the high density platform 100 includes front and rear air intake/exhaust without side ventilation thereby maintaining NEBS compliance and includes a modification of recessed portion 40 to provide an extension such that switch fabric cards are substantially flush with interface cards on a front side of the platform 100. Additionally, relative to the high density platform 10, the high density platform 100 is a half-rack system that is scalable to a double (full rack) sized system whereas the high density platform 10 is a full rack sized system.

In an exemplary embodiment, the high density platform 100 can be a network element that may consolidate the functionality of a multi-service provisioning platform (MSPP), digital cross connect (DCS), Ethernet and/or Optical Transport Network (OTN) switch, dense wave division multiplexing (DWDM) platform, etc. into a single, high-capacity intelligent switching system providing Layer 0, 1, and 2 consolidation. In another exemplary embodiment, the high density platform 100 can be any of an OTN add/drop multiplexer (ADM), a SONET/SDH/OTN ADM, a multi-service provisioning platform (MSPP), a digital cross-connect (DCS), an optical cross-connect, an optical switch, a router, a switch, a wavelength division multiplexing (WDM) terminal, an access/aggregation device, etc. That is, the high density platform 100 can be any digital and/or optical system with ingress and egress signals and switching therebetween of channels, timeslots, tributary units, packets, etc. utilizing OTN, SONET, SDH, Ethernet, IP, etc. In yet another exemplary embodiment, the high density platform 100 can be a high-rate Ethernet switch. While the high density platform 100 is generally shown as an optical network element, the shelf and system are contemplated for use with any switching fabric, network element, or network based thereon.

The high density platform 100 includes a housing 102 which can refer to any shelf, rack, cabinet, case, frame, or other apparatus used to arrange and/or support a plurality of electronic/optical components such as cards, including interface cards 114 and switch fabric cards 116. The housing 102 may be metal, plastic, or combination, or other suitable material and similar in construction to other housings, cabinets and/or racks used to hold electronic/optical components in place. Further, the housing 102 may be rack mounted in an ETSI, ANSI, etc. compliant rack or frame. The housing 102 has a front side 104, a rear side 106 opposite the front side 104, a right side 108 adjacent to both the front side 104 and the rear side 106, and a left side 110 opposite the right side and adjacent to both the front side 104 and the rear side 106. Air flow in the high density platform 100 is between the front side 104 and the rear side 106; there is no air flow through or between the sides 108, 110.

The housing 12 supports a set of interface cards 114 and a set of switch fabric cards 116. The interface cards 114 are arranged in a first direction 120. The switch fabric cards 116 are arranged substantially orthogonally, i.e., perpendicular, to the first direction 120. In this exemplary embodiment, the interface cards 114 are vertically aligned and the switch fabric cards 116 are horizontally aligned. The cards 114, 116 may optionally be surrounded by a separate metallic Faraday Cage including, for example a metal mesh screen. The orthogonal arrangement of the switch fabric cards 116 as compared with the interface cards 114 can form the recessed portion 40 as described herein. The high density platform 100 can include the recessed portion 40 for airflow while having the switch fabric cards 116 substantially flush with the interface cards 114 through an extension portion on the switch fabric cards 116. The extension portion provides a false front that extends the faceplate of the switch fabric cards 116 to be flush with the interface cards 114 while still maintaining open space forming the recessed portion 40.

The interface cards 114 can include optical transceivers, such as, for example, 1 Gb/s (GbE PHY), 2.5 Gb/s (OC-48/STM-1, OTU1, ODU1), 10 Gb/s (OC-192/STM-64, OTU2, ODU2, 10 GbE PHY), 40 Gb/s (OC-768/STM-256, OTU3, ODU3, 40 GbE PHY), 100 Gb/s (OTU4, ODU4, 100 GbE PHY), etc. Again, the interface cards 114 can be referred to as line cards, line blades, I/O modules, etc. and can include a plurality of optical modules in the front. For example, the optical modules can be pluggable modules such as, without limitation, XFP, SFP, XENPAK, X2, CFP, CFP2, CFP4, etc. Further, the interface cards 114 can include a plurality of optical connections per module and each module may include a flexible rate support for any type of connection, such as, for example, 155 Mb/s, 622 Mb/s, 1 Gb/s, 2.5 Gb/s, 10 Gb/s, 40 Gb/s, and 100 Gb/s, and any rate in between. The interface cards 114 can include wavelength division multiplexing interfaces, short reach interfaces, and the like, and can connect to other interface cards 114 on remote network elements, end clients, edge routers, and the like.

From a logical perspective, the interface cards 114 provide ingress and egress ports to the high density platform 100, and each interface card 114 can include one or more physical ports. The switch fabric cards 116 are configured to switch channels, timeslots, tributary units, packets, cells, etc. between the interface cards 114. For example, the interface cards 114 can provide wavelength granularity (Layer 0 switching), SONET/SDH granularity such as Synchronous Transport Signal-1 (STS-1) and variants/concatenations thereof (STS-n/STS-nc), Synchronous Transport Module level 1 (STM-1) and variants/concatenations thereof, Virtual Container 3 (VC3), etc.; OTN granularity such as Optical Channel Data Unit-1 (ODU1), Optical Channel Data Unit-2 (ODU2), Optical Channel Data Unit-3 (ODU3), Optical Channel Data Unit-4 (ODU4), Optical Channel Data Unit-flex (ODUflex), Optical channel Payload Virtual Containers (OPVCs), ODTUGs, etc.; Ethernet packet granularity; Digital Signal n (DSn) granularity such as DS0, DS1, DS3, etc.; and the like. Specifically, the switch fabric cards 116 can include both Time Division Multiplexed (TDM) (i.e., circuit switching) and packet switching engines. The interface cards 114 and/or the switch fabric cards 116 can include redundancy as well, such as 1:1, 1:N, etc. In an exemplary embodiment, the switch fabric cards 116 provide OTN, SONET, or SDH switching.

In an exemplary embodiment, the high density platform 100 can be 15-16 RU with 12 slots for the interface cards 114 and 4 slots for the switch fabric cards 116. Here, the high density platform 100 can dissipate between 600-750 W. Further, the switch fabric cards 116 can be single fabric or double fabric (with additional pins to the backplane from the single fabric). Additionally, the high density platform 100 contemplates operation in an ETSI, ANSI, 19", or 23" rack or frame.

Those of ordinary skill in the art will recognize the high density platform 100 can include other components which are omitted for illustration purposes, and that the systems and methods described herein are contemplated for use with a plurality of different network elements with the high density platform 100 presented as an exemplary type of network element. For the high density platform 100, other architectures providing ingress, egress, and switching therebetween are also contemplated for the systems and methods described herein. In general, the systems and methods described herein contemplate use with any network element providing switching of OTN, SONET, SDH, etc. channels, timeslots, tributary units, wavelengths, packets, cells, etc. Furthermore, the high density platform 100 is merely presented as one exemplary implementation for the systems and methods described herein. Those of ordinary skill in the art will recognize the systems and methods can be used for practically any type of network element which include separation of cards between horizontal alignment and vertical alignment.

In an exemplary embodiment, the high density platform 100 includes common equipment 130, power connections 132, and a fiber manager 134. The common equipment 130 is utilized for operations, administration, maintenance, and provisioning (OAM&P) access; user interface ports; and the like. The common equipment 130 can connect to a management system through a data communication network (DCN). For example, the common equipment 130 can include an Ethernet port for communication to the DCN. Additionally, the common equipment 130 can include a control plane processor configured to operate a control plane. The high density platform 100 can include an interface for communicatively coupling the common equipment 130, the interface cards 114, and the switch fabric cards 116 therebetween. For example, the interface can be a backplane, midplane, a bus, optical or electrical connectors, or the like. The interface cards 114 are configured to provide ingress and egress to the switch fabric cards 116 and external to the high density platform 100. In an exemplary embodiment, the interface cards 114 can form ingress and egress switches with the switch fabric cards 116 as center stage switches for a three-stage switch, e.g. a three stage Clos switch. Other configurations and/or architectures are also contemplated.

In an exemplary embodiment, the high density platform 100 includes the recessed portion 40 from FIG. 2 while maintaining keeping faceplates of the cards 114, 116 substantially flush. This is an important operational concern in having indicators on the cards 114, 116 simultaneously visible as well as for ease of card insertion/removal for the switch fabric cards 116. This feature is enabled through an extension or false front on the switch fabric cards 116.

Figure 7:
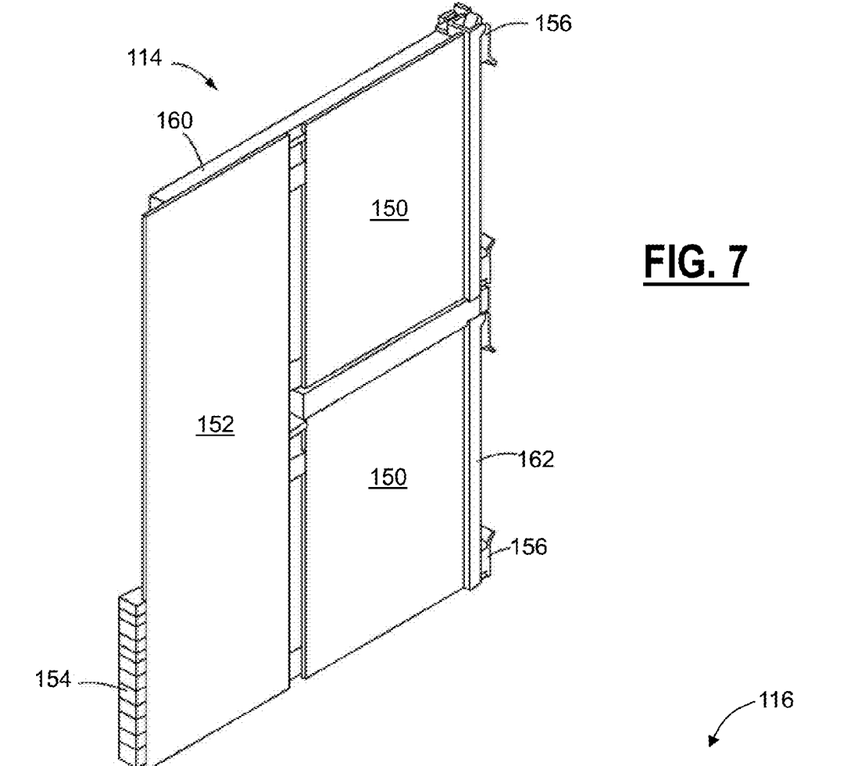
FIG. 7 is a perspective view of an exemplary interface card for the high density platform of FIGS. 3-6.

Referring to FIG. 7, in an exemplary embodiment, a perspective view illustrates an exemplary interface card 114. The exemplary interface card 114 can include pluggable optical circuit packs 150 coupled to processing circuitry 152 coupled to a connector 154 for attachment to a backplane in the high density platform 100. The exemplary interface card 114 can include latches 156 for secure attachment to the housing 102. The optical circuit packs 150 and the processing circuitry 152 can be mounted to a body 160, and the body 160 can be disposed to a faceplate 162. The faceplate 162 can include the latches 156 and visual indicators (not shown) such as LEDs. The body 160 can be generally thinner than the faceplate 162 and/or the connector 154 such that when the faceplate 162 of a set of exemplary interface cards 114 are arranged side by side, a small space, or slot, remains between the bodies of the exemplary interface cards 114, allowing air to pass between adjacent interface cards 48. Other cards, including the switch fabric cards 116 similarly can have a face that is thicker than the body in order to facilitate passage of air between adjacent cards and to allow indicators, such as light emitting diodes, to be positioned within the faceplate 162.

Figure 8:
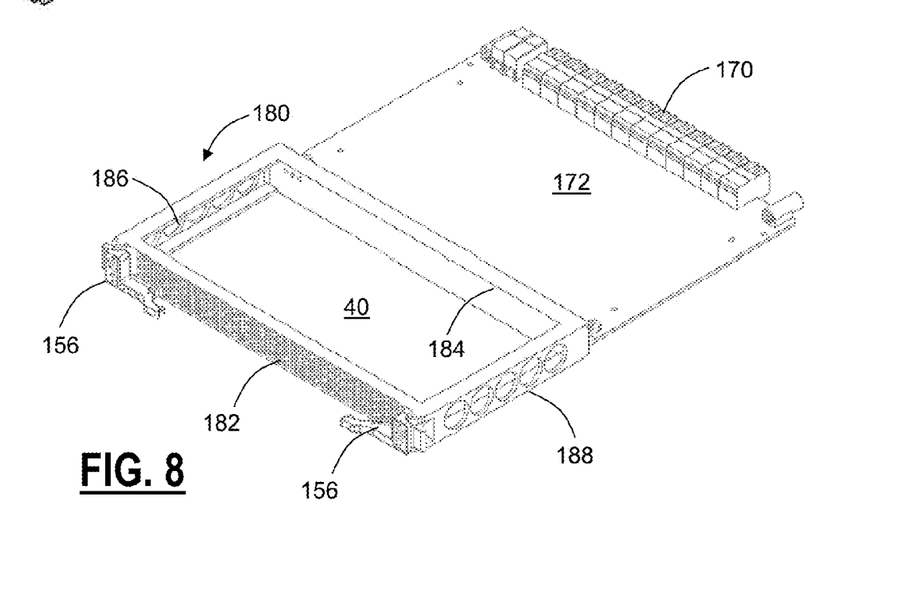
FIG. 8 is a perspective view of an exemplary switch fabric card for the high density platform of FIGS. 3-6.

Referring to FIG. 8, in an exemplary embodiment, a perspective view illustrates an exemplary switch fabric card 116. The exemplary switch fabric card 116 can include connectors 170 interfacing to the backplane of the housing 102 and coupled to printed circuit board (PCB) 172 which can include processing circuitry for the exemplary switch fabric card 116. The exemplary switch fabric card 116 includes an extension 180 disposed to the PCB 172. The extension 180 enables a faceplate 182 of the exemplary switch fabric card 116 to be substantially flush with the faceplate 162 of the exemplary interface cards 114 while forming the recessed portion 40 between the exemplary interface cards 114 and the exemplary switch fabric card 116. The PCB 172 is shorter than the body 160 of the exemplary interface card 114. However, with the extension 180, the exemplary switch fabric card 116 extends out in the front side 104 of the high density platform 100 about as much as the exemplary interface cards 114.

The extension 180 includes a back side 184 disposed to the PCB 172 and opposite the faceplate 182, a left side 186 adjacent to the faceplate 182 and the back side 184, and a right side 188 opposite the left side 186 and adjacent to the faceplate 182 and the back side 184. The faceplate 182 includes the include latches 156 for secure attachment to the housing 102. That is, the faceplate 182, which is a false faceplate (because it extends from the PCB 172) includes the latches 156 for insertion and removal of fabrics into the housing. The back side 184 can include an EMC wall at the front of the PCB 172 that also keeps the air in that moves across the exemplary switch fabric card 116 from right to left. The sides 186, 188 can be perforated to allow air to enter and turn upwards into the vertical exemplary interface cards 114 cards above. Also, the faceplate 182 can be perforated to allow air to enter and turn upwards into the vertical exemplary interface cards 114 cards above. In an exemplary embodiment, the sides 186, 188 include slits and the faceplate 182 includes a plurality of holes. The faceplate 182 and the sides 184, 186, 188 can be formed from a rigid material such that the extension 180 can be used to selectively insert or remove the exemplary switch fabric card 116 from the high density platform 100.

The faceplate 182 can include visual indicators of status of the exemplary switch fabric card 116, such as LEDs for operational status, alarms, warnings, etc. In an exemplary embodiment, the exemplary switch fabric card 116 can include light pipes on the faceplate 182 to extend light from LEDs at the back side 182 to the faceplate 182. In another exemplary embodiment, the faceplate 182 can include the LEDs thereon with wiring extending from the PCB 172 to the faceplate 182 via either the left side 186 or the right side 188. Variously, the faceplate 182 can be referred to as a false front or false faceplate since it is actually a faceplate on the extension 180. Advantageously, the extension 180 enables the recessed portion 40 to be formed for airflow efficiency in the high density platform 100 while providing operational benefits of having the faceplates 162, 182 substantially flush on the front side 104.

Referring back to FIGS. 3-6, airflow is confined to the front side 104 and the rear side 106 thereby maintaining NEBS compliance. There are no vents or openings for airflow on the sides 108, 110. The high density platform 100 includes two separate airflow paths—a first air path for the interface cards 114 and a second air path for the switch fabric cards 116. The first air path starts at a lower portion of the front side 104 at three points 200, 202, 204. The first point 200 for the first air path is through the false faceplates 182 of the switch fabric cards 116 and through the recessed portion 40. The second point 202 is through a ramp 210 that is part of left side fabric fans 220. Specifically, the ramp 210 extends the depth of the recessed portion 40 and opens at the front side 104 and allows air through to the interface cards 114. Behind the ramp 210 and extending to the rear side 106 are the left side fabric fans 220. The third point 204 is under the fiber manager 134.

The first air path includes interface fans 222 located above the interface cards 114 (shown in FIG. 6). The interface fans 222 create the first air path from the points 200, 202, 204 to exhaust openings 224 on an upper portion of the rear side 106 (shown in FIG. 5). From the points 200, 202, 204, the air is drawn upward by the interface fans 222 through the cage of the interface cards 114 to the exhaust openings 224. In this manner, the air flow for the first air path is confined to the interface cards 114, not the switch fabric cards 116. The second air path starts at a point 230 to the right of the switch fabric cards 116. The point 230 includes perforations for air intake on the right side of the switch fabric cards 116. The left side fabric fans 220 (shown in FIG. 6) draw the air from the point 230 back through the switch fabric cards 116 to an exhaust opening 232 on the lower rear left on the rear side (shown in FIG. 5). Again, the air flow for the second air path is confined to the switch fabric cards 116 and not the interface cards 114. Advantageously, airflow for both the air paths is front to rear. Note, other embodiments consistent with the first air path and the second air path are also contemplated herein. For example, the second air path is from right to left, but in another exemplary embodiment, this could be left to right with the fabric fans 220 located on the right side.

Figure 9:
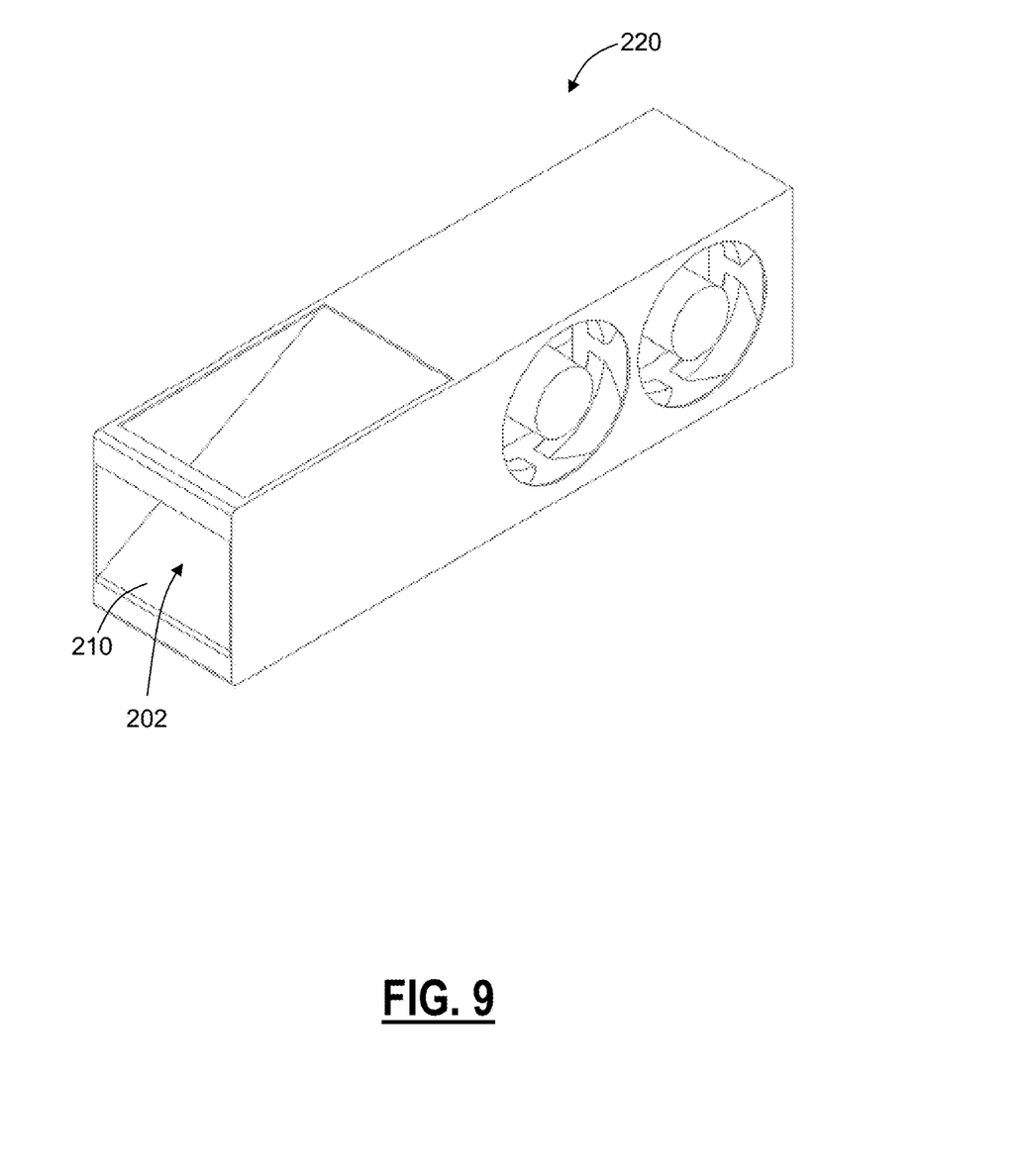
FIG. 9 is a perspective diagram of left side fabric fans and a ramp for the high density platform of FIGS. 3-6.

Referring to FIG. 9, in an exemplary embodiment, a perspective diagram illustrates the left side fabric fans 220 and the ramp 210. The fabric fans 220 draw air in from the right side where the switch fabric cards 116 sit and exhaust out the left side where it turns to the rear of the shelf. The ramp 210 at the front serves the same purpose as the false faceplates 182 on the switch fabric cards 116, to allow air to enter the front of the shelf and turns upwards in the second chimney for the interface cards 114.

Figure 10:
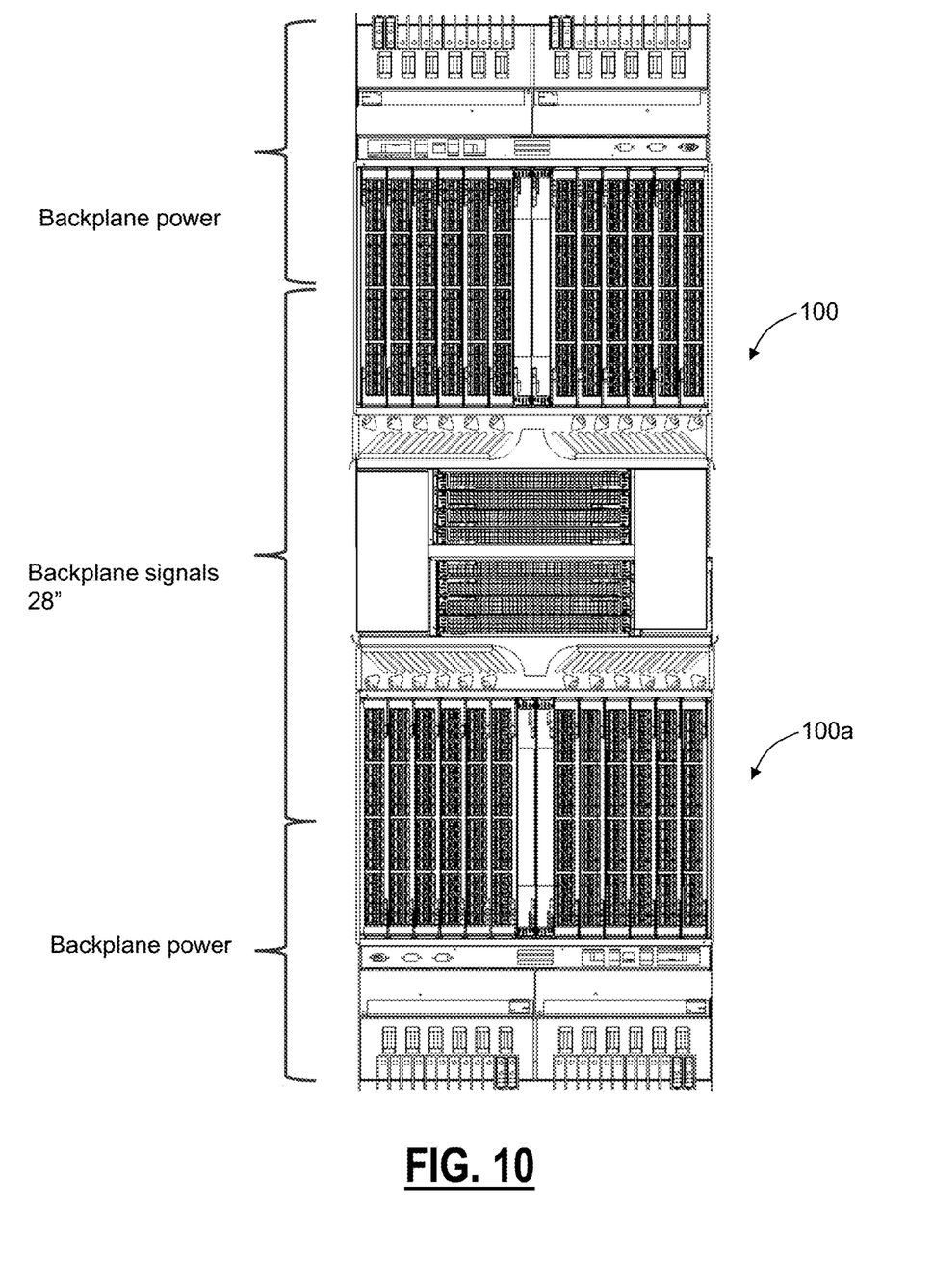
FIG. 10 is a front perspective diagram of a larger high density platform relative to the high density platform.

Referring to FIG. 10, in an exemplary embodiment, a front perspective diagram illustrates a larger high density platform 300 relative to the high density platform 100. The larger high density platform 300 has twice the physical capacity of the high density platform 100. The larger high density platform 300 is an integrated hardware system similar in features as the high density platform 100 described herein. For example, the high density platform 100 can take 15-16 RUs (e.g., about half a rack or frame) whereas the larger high density platform 300 can take an entire rack or frame. The larger high density platform 300 is effectively two of the high density platforms 100 in one frame with the bottom one being flipped horizontally such that all of the switch fabric cards 116 are together and there are two sets of interface cards 114—a top set and a bottom set. In this configuration, backplane traces are minimized between the switch fabric cards 116 and the interface cards 114. The larger high density platform 300 can include the false faceplates 182 and the front-to-rear air flow as described herein for the high density platform 100.

Advantageously, the high density platform 100 includes horizontal and vertical cards coexisting in the same system that is a backplane designed system as opposed to a midplane designed system (i.e., it is not unusual to find a midplane designed system with vertical cards on one side and horizontal on the other side). Additionally, the high density platform 100 effectively recesses the effective front of the horizontal fabric cards with a false faceplate. This allows the horizontal cards to be cooled from right to left in a separate air chimney from the interface cards while the front area of the fabric cards services as air inlet and plenum for the interface card bottom to top vertical airflow chimney.

In this new system design, the fabric card slots were removed from the card cage that houses the interface card slots to allow each interface card to be wider pitch in order to increase interface card space and cooling capability of the interface cards. The switch fabric cards were then moved to their own cage but arranged horizontally below the interface card cage so that the backplane trace lengths would remain short enough to allow high speed 25 Gbps+ between all interface slots and all fabric slots. Additionally, the switch fabric cards are made recessed at the front with a false faceplate to allow more air intake to the interface cards above, reducing the space required between the interface and switch fabric card cages. The switch fabric cards are in their own cooling chimney using side to side airflow that maintains front system air intake and rear system air exhaust.

This system allows more interface cards to fit in an ETSI wide shelf (rack) of sufficient card pitch to house newer optic modules such as CFP2 and CFP4 for adequate cooling. The interface card cooling is increased while maintaining short backplane traces between interface and switch fabric cards that are oriented horizontally below the interface cards. Without this new system, a system would need to have at least one of the following attributes: 1) 23" wide rack instead of ETSI wide rack to fit all the cards, or 2) less interface cards, e.g. 10× interface cards instead of 12× interface cards, or 3) interface card pitch=1.31" or less instead of interface card pitch=1.42". This compromise in pitch is enough to reduce cooling and make some interface card types difficult to design and more expensive to manufacture.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A system, comprising:
one or more cards vertically insertable into a backplane;
one or more cards horizontally insertable into the backplane, wherein the one or more cards horizontally insertable comprise a false faceplate that is substantially flush with a faceplate of the one or more cards vertically insertable when each is inserted in the backplane;
wherein a first air path is defined for air flow to cool the one or more cards vertically insertable;
wherein a second air path is defined for air flow to cool the one or more cards horizontally insertable, wherein each of the first air path and the second air path begin at a front portion of the system and end at a rear portion of the system;
a recess portion between the one or more cards vertically insertable and the one or more cards horizontally insertable, wherein the recess portion is formed by an extension on each of the one or more cards horizontally insertable, wherein the first air path extends from the recess portion to exhaust openings on a rear portion of the system, wherein interface fans are located above the one or more cards vertically insertable, wherein the first air path extends from lower portions of the front portion of the system to exhaust openings on a rear portion of the system; and fabric fans located on a side of the one or more cards horizontally insertable, wherein the second air path extends from an opening on an opposite side from the fabric fans to exhaust openings on a lower rear portion of the system.

2. The system of claim 1, wherein the first air path and the second air path are separate.

3. The system of claim 1, wherein the false faceplate comprises light pipes to display visual indicators from the one or more cards horizontally insertable.

4. The system of claim 1, wherein the one or more cards horizontally insertable are shorter in depth than the one or more cards vertically insertable and the false faceplate extends the one or more cards horizontally insertable to be substantially equal in depth to the one or more cards vertically insertable.

5. The system of claim 1, wherein the one or more cards vertically insertable comprise a first set of cards located above the one or more cards horizontally insertable, and further comprising:

one or more cards comprising a second set of cards vertically insertable located below the one or more cards horizontally insertable.

6. The system of claim 1, wherein the system is mountable in a 19", ETSI, or 21" rack or frame.

7. A shelf, comprising:

a housing;

a first cage in the housing for vertically insertable cards;

a second cage in the housing for horizontally insertable cards, wherein the second cage is shorter in depth than the first cage thereby forming a recess portion therebetween, wherein the horizontally insertable cards each comprise a false faceplate that is substantially flush with a faceplate of the vertically insertable cards when each is inserted in their associated cage;

wherein a first air path is defined for air flow to cool the first cage;

wherein a second air path is defined for air flow to cool the second cage, wherein each of the first air path and the second air path begin at a front portion of the housing and end at a rear portion of the housing, wherein the first air path extends from the recess portion to exhaust openings on a rear portion of the housing; and interface fans located above the first cage, wherein the first air path extends from lower portions of the front portion of the housing to exhaust openings on a rear portion of the housing, and fabric fans located on a side of the second cage, wherein the second air path extends from an opening on an opposite side from the fabric fans to exhaust openings on a lower rear portion of the housing.

8. The shelf of claim 7, wherein the first air path and the second air path are separate.

9. The shelf of claim 7, wherein the false faceplate comprises light pipes to display visual indicators from the horizontally insertable cards.

10. The shelf of claim 7, wherein the horizontally insertable cards are shorter in depth than the vertically insertable cards and the false faceplate extends the horizontally insertable cards to be substantially equal in depth to the vertically insertable cards.

11. The shelf of claim 7, wherein the interface cage comprises a first interface cage located above the switch fabric cage, and further comprising:

a second interface cage located below the switch fabric cage.

12. The shelf of claim 7, wherein the shelf is mountable in a 19", ETSI, or 21" rack or frame.

13. A high density platform, comprising:

a housing mountable in a 12" rack;

one or more cards vertically insertable into a backplane of the housing;

one or more cards horizontally insertable into the backplane, wherein the one or more cards horizontally insertable comprise a false faceplate that is substantially flush with a faceplate of the one or more cards vertically insertable when each is inserted in the backplane;

wherein the one or more cards horizontally insertable are shorter in depth than the one or more cards vertically insertable and the false faceplate extends the one or more cards horizontally insertable to be substantially equal in depth to the one or more cards vertically insertable while concurrently forming an open recess portion between the one or more cards horizontally insertable and the one or more cards vertically insertable for air flow;

wherein interface fans are located above the one or more cards vertically insertable, wherein a first air path extends from the open recess portion to exhaust openings on a rear portion of the housing; and wherein fabric fans located on a side of the one or more cards horizontally insertable, wherein a second air path extends from an opening on opposite side from the fabric fans to exhaust openings on a lower rear portion of the housing.

* * * * *